(12) United States Patent
Belau et al.

(10) Patent No.: US 12,406,852 B2
(45) Date of Patent: Sep. 2, 2025

(54) PROFILE OPTIMIZATION FOR HIGH ASPECT RATIO MEMORY USING AN ETCH FRONT METAL CATALYST

(71) Applicant: Lam Research Corporation, Fremont, CA (US)

(72) Inventors: Leonid Belau, Pleasanton, CA (US); Eric Hudson, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 279 days.

(21) Appl. No.: 18/011,465

(22) PCT Filed: Dec. 8, 2021

(86) PCT No.: PCT/US2021/062453
§ 371 (c)(1),
(2) Date: Dec. 19, 2022

(87) PCT Pub. No.: WO2022/159191
PCT Pub. Date: Jul. 28, 2022

(65) Prior Publication Data
US 2023/0369061 A1    Nov. 16, 2023

Related U.S. Application Data

(60) Provisional application No. 63/140,134, filed on Jan. 21, 2021.

(51) Int. Cl.
*H01L 21/311* (2006.01)
(52) U.S. Cl.
CPC .. *H01L 21/31116* (2013.01); *H01L 21/31144* (2013.01)
(58) Field of Classification Search
CPC .............. H01L 21/00–86; H10B 43/00–50
See application file for complete search history.

(56) References Cited

U.S. PATENT DOCUMENTS

| 9,620,377 B2 | 4/2017 | Hudson et al. |
| 10,170,323 B2 | 1/2019 | Hudson et al. |

(Continued)

FOREIGN PATENT DOCUMENTS

| JP | 9-92644 | 4/1997 |
| JP | 2018-141146 | 9/2018 |

(Continued)

OTHER PUBLICATIONS

International Search Report and Written Opinion from International Application No. PCT/US2021/062453 dated Apr. 5, 2022.

(Continued)

*Primary Examiner* — Joshua L Allen
*Assistant Examiner* — Andrew Keelan Laobak
(74) *Attorney, Agent, or Firm* — Beyer Law Group LLP

(57) ABSTRACT

A method for etching features in a silicon containing stack below a patterned mask is provided. The stack is partially etched by providing a halogen containing etch gas and forming the halogen containing etch gas into a halogen containing plasma, wherein the halogen containing plasma partially etches features with an etch front. A metal catalyst containing layer is deposited on the etch front of the features by providing a metal catalyst containing gas, forming the metal catalyst containing gas into a plasma, and selectively depositing more of the metal catalyst containing layer on the etch front and bottoms of the features than tops of the features. The features are further etched by providing a fluorine containing etch gas and forming a fluorine containing plasma, wherein the plasma selectively etches sidewalls adjacent to the etch front of the features with respect to sidewalls adjacent to tops of the features.

18 Claims, 5 Drawing Sheets

(56) References Cited

U.S. PATENT DOCUMENTS

| | | | |
|---|---|---|---|
| 11,566,177 B2 | 1/2023 | Oomori et al. | |
| 2013/0280908 A1 | 10/2013 | Li et al. | |
| 2014/0080310 A1 | 3/2014 | Chen et al. | |
| 2015/0191825 A1* | 7/2015 | Hildreth | C23C 18/1657 |
| | | | 427/256 |
| 2017/0243751 A1 | 8/2017 | Li et al. | |
| 2017/0243908 A1 | 8/2017 | Chien et al. | |
| 2020/0365464 A1* | 11/2020 | Sreenivasan | G02B 6/136 |

FOREIGN PATENT DOCUMENTS

| | | | |
|---|---|---|---|
| KR | 2020-0090237 | 7/2020 | |
| WO | WO-2018026867 A1 * | 2/2018 | ....... C23C 16/45525 |
| WO | 2019/108366 | 6/2019 | |
| WO | 2019/178030 | 9/2019 | |
| WO | 2020/176425 | 9/2020 | |
| WO | 2020/190878 | 9/2020 | |

OTHER PUBLICATIONS

Notice of Reason of Refusal from Japanese Application No. 2023-54862 dated Jul. 1, 2025.

* cited by examiner

PROFILE OPTIMIZATION FOR HIGH ASPECT RATIO MEMORY USING AN ETCH FRONT METAL CATALYST

CROSS-REFERENCE TO RELATED APPLICATION

This application claims the benefit of priority of U.S. Application No. 63/140,134, filed Jan. 21, 2021, which is incorporated herein by reference for all purposes.

BACKGROUND

The disclosure relates to a method of forming semiconductor devices on a semiconductor wafer.

In forming semiconductor devices, etch layers may be etched to form memory holes or lines or other semiconductor features. Some semiconductor devices may be formed by etching a single stack of silicon dioxide ($SiO_2$), for example, to form a capacitor in dynamic access random memory (DRAM). Other semiconductor devices may be formed by etching stacks of bilayers of alternating silicon dioxide (oxide) and silicon nitride (nitride) (ONON), or alternating silicon dioxide and polysilicon (OPOP). Such stacks may be used in memory applications and three dimensional "not and" gates (3D NAND). These stacks tend to require relatively high aspect ratio (HAR) etching of the dielectrics. For high aspect ratio etches, examples of desired etch characteristics are high etch selectivity to the mask (such as an amorphous carbon mask), low sidewall etching with straight profiles, and high etch rate at the etch front. Some high aspect ratio etches result in tapered features that are much wider at the top than the bottom. Such features may increase device failure or limit device density, device performance, and device depth.

The background description provided here is for the purpose of generally presenting the context of the disclosure. Information described in this background section, as well as aspects of the description that may not otherwise qualify as prior art at the time of filing, are neither expressly nor impliedly admitted as prior art against the present disclosure.

SUMMARY

To achieve the foregoing and in accordance with the purpose of the present disclosure, a method for etching features in a silicon containing stack below a patterned mask in an etch chamber is provided. The stack is partially etched by providing a halogen containing etch gas and forming the halogen containing etch gas into a halogen containing plasma, wherein the halogen containing plasma partially etches features into the stack, wherein the features have an etch front. A metal catalyst containing layer is deposited on the etch front of the features by providing a metal catalyst containing gas, forming the metal catalyst containing gas into a metal catalyst containing plasma, and selectively depositing more of the metal catalyst containing layer on the etch front and bottoms of the features than tops of the features. The features are further etched by providing a fluorine containing etch gas and forming the fluorine containing etch gas into a fluorine containing plasma, wherein the fluorine containing plasma selectively etches sidewalls adjacent to the etch front of the features with respect to sidewalls adjacent to tops of the features.

In another manifestation, a method for etching features in a silicon containing stack below a patterned mask in an etch is provided. The stack is partially etched by providing a halogen containing etch gas and forming the halogen containing etch gas into a halogen containing plasma, wherein the halogen containing plasma partially etches features into the stack, wherein the features have an etch front. A liner is deposited on sidewalls of the features. A metal catalyst containing layer is deposited on the liner by providing a metal catalyst containing gas and forming the metal catalyst containing gas into a metal catalyst containing plasma, wherein the metal catalyst containing plasma causes the metal catalyst containing layer to be deposited on the liner. The features are further etched by providing a fluorine containing etch gas and forming the fluorine containing etch gas into a fluorine containing plasma, wherein the fluorine containing plasma selectively etches the liner near an etch front and forms a plasma of the metal catalyst containing layer, wherein the plasma of the metal catalyst containing layer isotropically etches the etch front.

These and other features of the present disclosure will be described in more detail below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Dry development of high aspect ratio contacts requires strict control of the tapering angle of the sidewall. Various methods try to limit lateral critical dimension (CD) differences between top and bottom parts of the etched structures. With the recent development of 3D NAND memory having thicker structures with an increased number of ONON or OPOP bilayers, the demand for tight control of top and bottom geometries is especially significant. In case the profile (difference between the top and bottom CD's) increases, subsequent steps of device manufacturing will be at risk that will impact device performance. In the current technology, reactive ion etching of high aspect ratio structures relies on sidewall deposition to protect CD lateral erosion. A delicate balance between etching and sidewall deposition is especially difficult to maintain for high aspect ratio features. As a result, high aspect ratio dry development is limited to thinner structures and requires significant complex development to enable thick stack to be etched.

Figure 1:
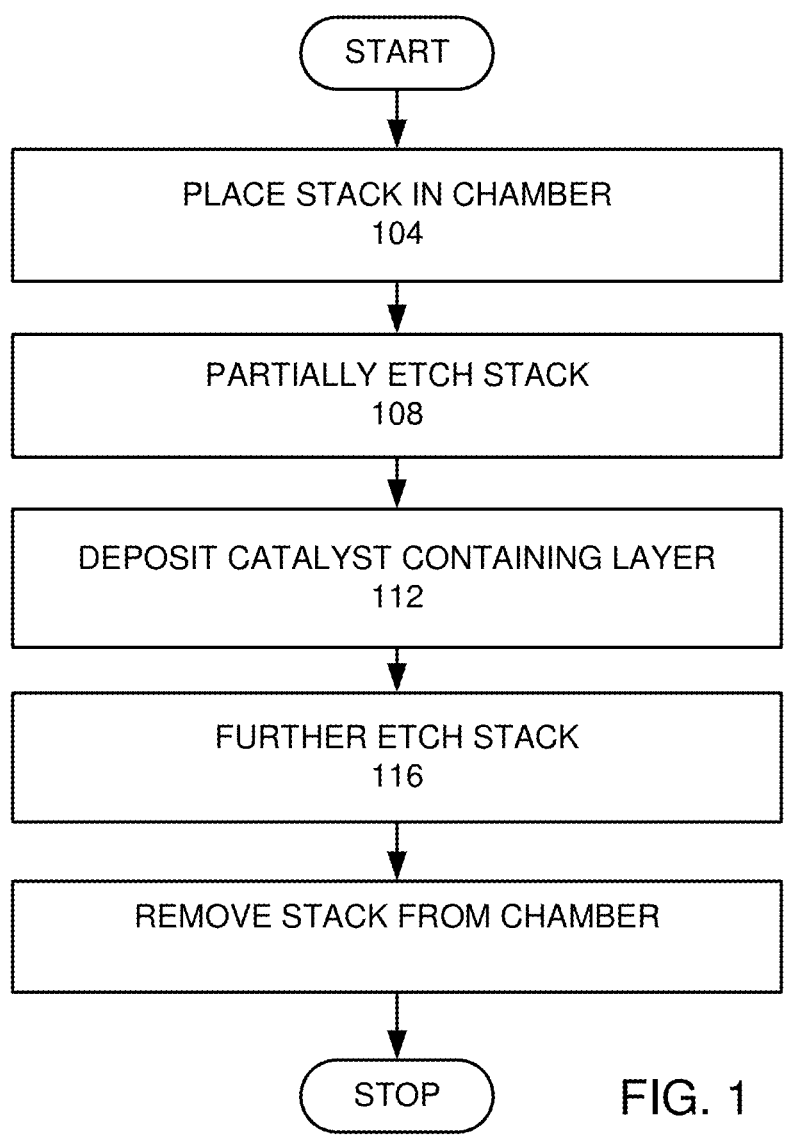
FIG. 1 is a high level flow chart of an embodiment.
Figure 2A:
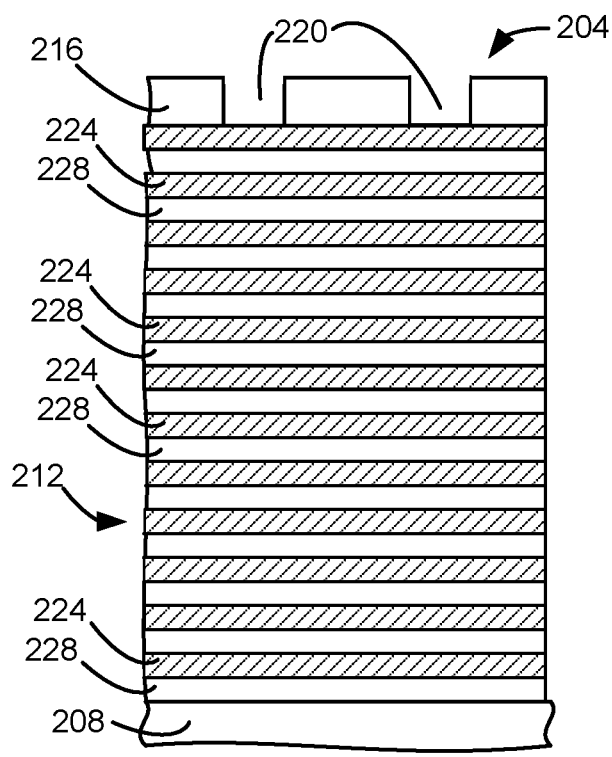
FIGS. 2A-D are schematic cross-sectional views of a stack processed according to an embodiment.

Embodiments described herein provide deeper high aspect ratio features etched in a stack, where widths of the features near the top of the features are about equal to widths of the features near the bottoms of the features. To facilitate understanding, FIG. 1 is a high level flow chart of an embodiment. In this exemplary embodiment, a stack is placed in an etch chamber (step 104). FIG. 2A is a schematic cross-sectional view of a stack 204. In this embodiment, the stack 204 comprises a substrate 208 under a plurality of bilayers 212 disposed below a patterned mask 216. In this example, one or more layers may be disposed between the substrate 208 and the plurality of bilayers 212 and/or the plurality of bilayers 212 and the patterned mask 216. In this example, the patterned mask 216 is a carbon containing patterned mask, such as amorphous carbon. This embodiment does not have a silicon containing mask above the plurality of bilayers 212 or above the patterned mask 216. In this example, the patterned mask pattern provides mask features 220 for high aspect ratio contacts. In some embodiments, the mask features 220 are formed before the stack 204 is placed in the etch chamber. In other embodiments, the mask features 220 are formed while the stack 204 is in the etch chamber. In this embodiment, each bilayer 212 includes a layer of silicon oxide 224 and a layer of silicon nitride 228.

The stack 204 is partially etched (step 108). An etch gas is flowed into the etch chamber. In this example, the etch gas is a halogen containing gas, such as a gas with a carbon tetrafluoride ($CF_4$) or more generally may be a fluorocarbon ($CF_x$), component. In this example, a pressure of 5 to 60 mTorr is provided. The etch gas is formed into an etch plasma. The etch plasma is a halogen containing plasma. This may be accomplished by providing an excitation RF with a frequency of 60 megahertz (MHz) at 200 to 20000 watts. The stack 204 is exposed to the etch plasma. A bias with a magnitude of at least about 200 volts is provided. In this embodiment, the bias is provided by providing an RF with a frequency of 400 kHz at 2 kW to 100 kW by an ESC source to an ESC (electrostatic chuck). The bias causes ions to be accelerated to the stack 204 causing the selective etching of high aspect ratio etch features into the plurality of bilayers 212 with respect to the patterned mask 216. The etch plasma is maintained for 180 to 3600 seconds. The etch is able to etch both the silicon oxide 224 and silicon nitride 228 layers. In various embodiments, the etch gas is titanium free. In various embodiments, the etch gas is metal catalyst free. A metal catalyst is defined herein as being a metal containing material that reduces the activation barrier for silicon fluorination in reactions. In this embodiment, the metal catalyst is titanium. In various embodiments, the etch gas is metal free. A metal catalyst free etch gas might not be metal free, if the etch gas has a metal containing component that is not a metal catalyst. The carbon component of $CF_4$ may be used to deposit a carbon passivation layer to protect the sidewalls of the features during etching. In other embodiments, the etch gas may further comprise a separate carbon containing component.

Figure 2B:
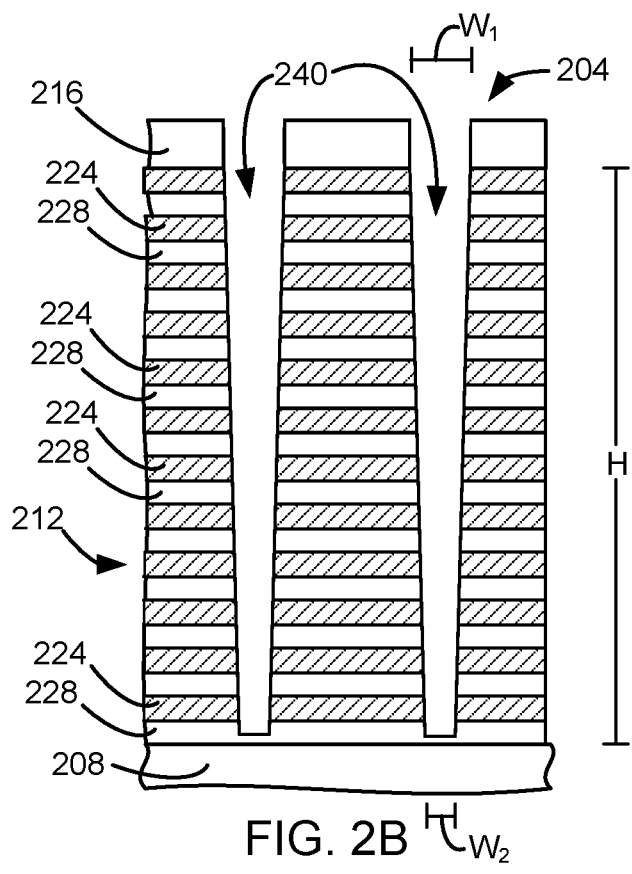

FIG. 2B is a schematic cross-sectional view of a stack 204 after the stack has been partially etched to form partially etched features 240. In this embodiment, the plurality of bilayers 212 has a height H. In this embodiment, the features 240 will have a final depth equal to the height H of the plurality of bilayers 212. In other embodiments, the features 240 have a final depth less than the height H. The partial etch causes the features 240 to be tapered. In this embodiment, the tops of the features 240 have a top width of $W_1$ and the bottoms of the features 240 have a bottom width of $W_2$, where $W_1$ is greater than $W_2$. In various embodiments, the ratio of $W_1$ to $W_2$ is in the range of 2:1 to 10:1. The partial etching etches at least 90% of the final depth of the features. The partial etch is titanium free. In this embodiment, the partial etch is metal catalyst free. The partial etch is a highly anisotropic etch, as seen in that the depth of the etched features 240 is much greater than the width of the features 240.

After the partial etch is completed, a metal catalyst containing layer is deposited in the partially etched features 240 (step 112). In this embodiment, a metal catalyst containing gas is provided. In this embodiment, the metal catalyst containing gas is titanium tetrachloride ($TiCl_4$). The metal catalyst containing gas is formed into a metal catalyst containing plasma. This may be accomplished by providing an excitation RF with a frequency of 60 MHz at 50 to 20000 watts. The stack 204 is exposed to the metal catalyst containing plasma. A bias with a magnitude of at least about 20 volts is provided. In this embodiment, the bias is provided by providing an RF with a frequency of 400 kHz at 100 W to 100 kW by the ESC source to the ESC. The bias causes ions to be accelerated to the stack 204 causing the metal catalyst containing layer to be deposited at the bottom of the partially etched features 240. In this embodiment, the metal catalyst is selectively deposited on the bottom of the partially etched features 240 forming a metal catalyst containing layer, so that more of the metal catalyst containing layer is deposited on the bottom of the partially etched features 240 than the top of the partially etched features 240.

Figure 2C:
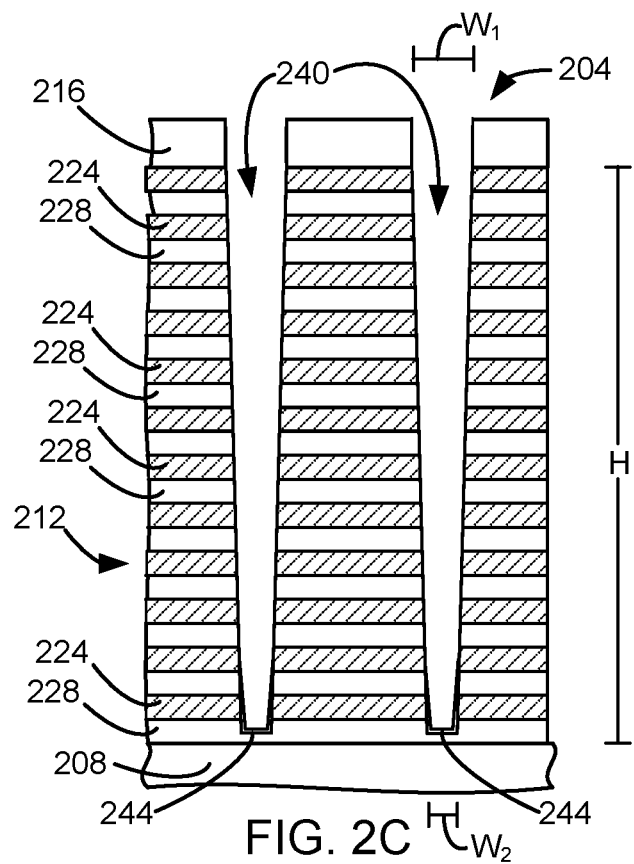

FIG. 2C is a schematic cross-sectional view of a stack 204 after a metal catalyst containing layer 244 is deposited. In this embodiment, the metal catalyst containing layer 244 is deposited on the sidewalls of the etched feature with an increased density near the bottom of the partially etched features 240, as shown, so that more of the metal catalyst containing layer 244 is deposited on the bottom of the partially etched features 240 than the top of the partially etched features 240. In this example, the metal catalyst containing layer 244 is deposited on the bottom of the etched features 240 and the sidewalls of the etched features near the bottom of the partially etched features 240. In this embodiment, the metal catalyst containing layer 244 comprises titanium. In this embodiment, the metal catalyst containing layer 244 does not deposit on the top 50% of the partially etched features 240. In other embodiments, the metal catalyst containing layer 244 does not deposit on the top 75% of the partially etched features 240. Instead, 90% by weight of the metal catalyst containing layer 244 deposits on the etch front on the bottom of the partially etched features 240 and the bottom 10% of the sidewalls of the partially etched features 240. In this embodiment, the metal catalyst containing layer 244 is between 1 to 5 monolayers thick. In this embodiment, the metal catalyst containing layer 244 has a thickness of between 0.1 nm and 10 nm. In an embodiment, more than 50% of the metal catalyst containing layer 244 by weight is deposited on the bottom 50% of the partially etched features. In an embodiment, more than 75% of the metal catalyst containing layer 244 by weight is deposited on the bottom 50% of the partially etched features.

The partially etched features 240 are further etched (step 116). In this example, the etch gas is a fluorine containing gas, such as a gas with a $CF_x$ component, for example, $CF_4$. In other embodiments, the fluorine containing gas may be a fluorocarbon ($C_xF_y$) or a hydrofluorocarbon ($C_xH_yF_z$). The etch gas may have additional additives such as oxygen ($O_2$), hydrogen ($H_2$), nitrogen tri-fluoride ($NF_3$), etc. In this example, a pressure of 5 to 60 mTorr is provided. The etch gas is formed into an etch plasma. In this embodiment, the etch plasma is a fluorine containing plasma. This may be accomplished by providing an excitation RF with a frequency of 60 MHz at 200 to 20000 watts. The stack 204 is exposed to the etch plasma. A bias with a magnitude of at least about 200 volts is provided. In this embodiment, the bias is provided by providing an RF with a frequency of 400 kHz at 2 kW to 100 kW source to the ESC. The bias causes ions to be accelerated to the stack 204 causing the selective etching of high aspect ratio etch features into the plurality of bilayers 212 with respect to the patterned mask 216. In this embodiment, the etching of the features 240 is completed. As noted earlier, the metal catalyst containing layer 244 includes titanium which acts as a metal catalyst. The titanium increases isotropic etching primarily near the bottom of the partially etched features 240, where the metal catalyst containing layer 244 is deposited. In the presence of oxygen (from the plasma or as a etch by-products), titanium will be readily oxidized to form titanium dioxide ($TiO_2$). $TiO_2$ could enhance reactive ion etching by a) reducing the activation barrier for silicon fluorination in reactions, b) increasing free fluorine density at the etch front, and c) reducing reactive species recombination, such as fluorine. The presence of the metal catalyst causes selective etching of sidewalls adjacent to the etch front with respect to sidewalls adjacent to the tops of the features. In this embodiment, the plasma from the metal catalyst allows for isotropically etching the etch front.

Figure 2D:
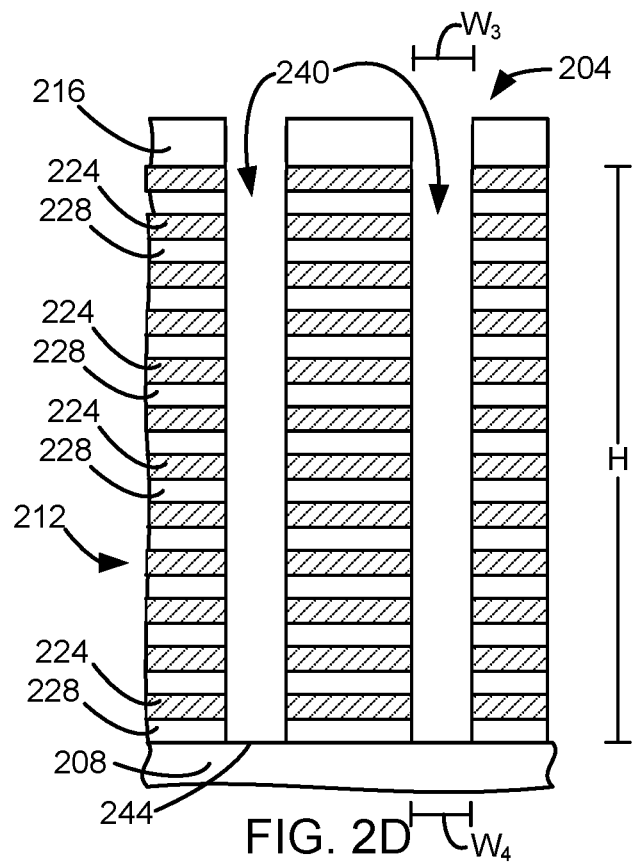

FIG. 2D is a schematic cross-sectional view of a stack 204 after features 240 have been further etched. The metal catalyst containing layer 244 (shown in FIG. 2C) causes the sidewalls near the bottoms of the features 240 and the etch front to etch faster causing the features 240 to be completely etched and the widths $W_4$ at the bottom of the features to increase. In this embodiment, the width of the tops of the features 240 is $W_3$. In various embodiments, the ratio of $W_3$ to $W_4$ is in the range of 1:1.05 to 1:05 to 1. In this embodiment, the final feature depth is the height H of the plurality of bilayers 212. Therefore, the partial etch etches the features 240 to have a depth of at least 90% of the height H of the plurality of bilayers 212. In addition, bowing could be reduced. Bowing is defined as the condition when the widths of the features between the top of the features 240 and the bottom of the features 240 are greater than $W_3$ and $W_4$. In an embodiment, the difference between widths at any two points along the features 240 is less than 10% of one of the widths.

The Oxide/Nitride (ONON) multilayer stack may be etched to form features, such as contact holes or trenches in making a 3D NAND memory device. Other embodiments may be used for dynamic random access memory (DRAM) Capacitor etching. Other embodiments may be used to etch silicon oxide and polysilicon bilayers (OPOP). Embodiments provide an etch depth of greater than 1 micron. In other embodiments, the etch depth is greater than 10 microns. Such embodiments allow the etching of at least 48 bilayers of silicon oxide and silicon nitride in a single etch step using a single amorphous carbon mask with a thickness of less than 1 microns. In addition, the contacts preferably have an etch depth to width aspect ratio of greater than 30:1. Various embodiments have a top and bottom feature width between 20 nm and 120 nm.

An advantage of an embodiment is the ability of a device manufacturer to be able to have a more precise control of the profile of a high aspect feature. Various embodiments enable increasing the bottom CD for very high aspect features. Various embodiments enable next generations of devices that rely on deeper structures with higher aspect ratios. Various embodiments reduce the cost of device manufacturing by reducing the number of steps for the development of high aspect ratio contacts. Various embodiments reduce the variation of the width of the features along the depth of the features so that the difference between widths at any two points along the depth of the features 240 is less than 10%.

In some embodiments, the stack may be a single layer of silicon oxide or silicon nitride or a single layer of silicon. In other embodiments, the stack may be a single layer or multiple layers of other silicon containing materials. In some embodiments, oxygen containing by-products of silicon oxide etching will enhance catalytic properties of deposited metal catalyst containing layer 244 in the features 240. This will increase the isotropic etching of the silicon containing structure. In addition, nitrogen in the silicon nitride increases the isotropic etching promoted by the metal catalyst. In other embodiments, oxygen ($O_2$) can be added to the gas mixture to enhance catalytic properties of metal catalyst containing layer 244.

In other embodiments, the metal catalyst containing layer 244 may comprise at least one of a cadmium containing component, a tungsten containing component, and a palladium containing component. In various embodiments, the metal catalyst containing gas comprises at least one of titanium tetrachloride ($TiCl_4$), titanium butoxide ($Ti(OBu)_4$, titanium ethoxide ($Ti(OC_2H_5)_4$, titanium propoxide ($Ti(OCH(CH_3)_2)_4$), and trimethoxy(pentamethycyclopentadienyl)titanium ($C_5(CH_3)_5Ti(OCH_3)_3$). In some embodiments, the metal catalyst containing gas may comprise a titanium containing component in the form of $Ti(NR_1R_2)_4$, where $R_1$ and $R_2$ could be a methyl ion ($CH_3$), an ethyl ion ($C_2H_5$), or propyl ion ($C_3H_7$). An example of such a metal catalyst is tetrakis(dimethylamino)titanium (TDMAT), where $R_1=R_2=CH_3$ providing a formula $Ti(N(CH_3)_2)_4$. Although other metal catalyst containing gases may be used, the more volatile metal catalyst containing gases will deposit more of the metal catalyst component at the bottom of the features 240. If gases are provided at a temperature above 250° C., titanium tetrafluoride ($TiF_4$), titanium tetrabromide ($TiBr_4$), and titanium tetrachloride ($TiCl_4$) may be used as a metal catalyst containing gases.

In another embodiment, a carbon based liner is deposited on sidewalls of the partially etched features 240 after the partial etching. A metal catalyst containing layer 244 is deposited over the carbon based liner. The carbon based liner prevents the metal catalyst containing layer 244 from depositing directly on sidewalls of the features at least near the top of the features. The stack is further etched (step 116). The further etching etches away the liner at the etch front and also generates a metal catalyst containing plasma. The plasma of the metal catalyst isotropically etches the etch front. The parts of the feature near the etch front, where the liner has been removed, is the only part of the feature that is exposed to the metal catalyst containing plasma causing isotropic etching of the etch front of the features. In such embodiments, the metal catalyst only increases the etching of the bottom parts of the features, where the liner has been removed. In some embodiments, the liner may be made of another material instead of carbon. In such embodiments, the liner is metal catalyst free.

Figure 3:
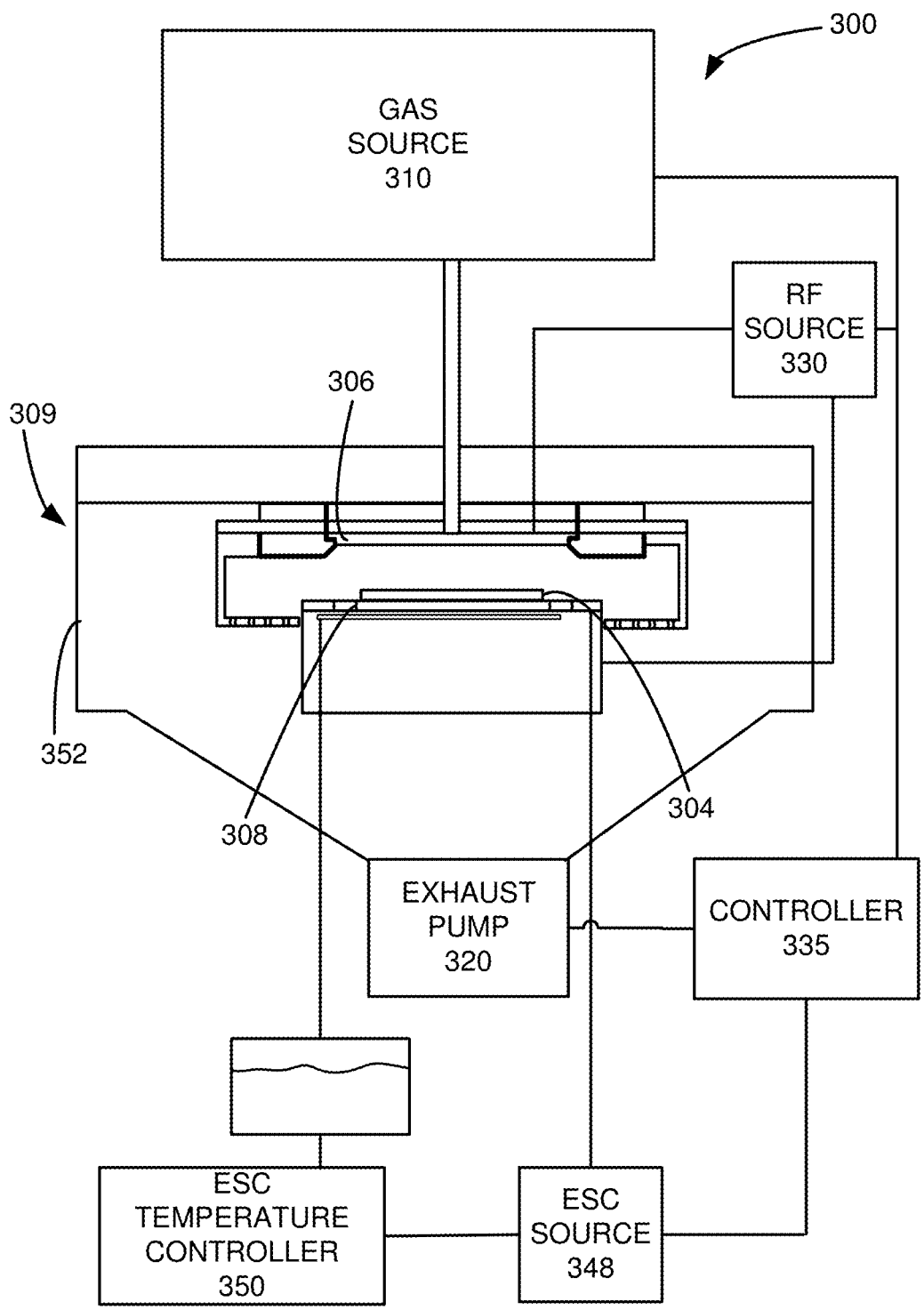
FIG. 3 is a schematic view of an etch chamber that may be used in an embodiment.

FIG. 3 is a schematic view of an etch reactor system 300 that may be used in an embodiment. In one or more embodiments, an etch reactor system 300 comprises a gas distribution plate 306 providing a gas inlet and an electrostatic chuck (ESC) 308, within an etch chamber 309, enclosed by a chamber wall 352. Within the etch chamber 309, a stack 304 is positioned over the ESC 308. The ESC 308 may provide a bias from the ESC source 348. An etch gas source 310 is connected to the etch chamber 309 through the gas distribution plate 306. An ESC temperature controller 350 is connected to the ESC 308. A radio frequency (RF) source 330 provides RF power to a lower electrode and/or an upper electrode, which in this embodiment are the ESC 308 and the gas distribution plate 306, respectively. In an exemplary embodiment, 400 kilohertz (kHz), 60 megahertz (MHz), and optionally, 2 MHz, 27 MHz power sources make up the RF source 330 and the ESC source 348. In this embodiment, the upper electrode is grounded. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments. A controller 335 is controllably connected to the RF source 330, the ESC source 348, an exhaust pump 320, and the etch gas source 310. An example of such an etch chamber is the Flex™ etch system manufactured by Lam Research Corporation of Fremont, CA. The process chamber can be a CCP (capacitively coupled plasma) reactor or an ICP (inductively coupled plasma) reactor.

Figure 4:
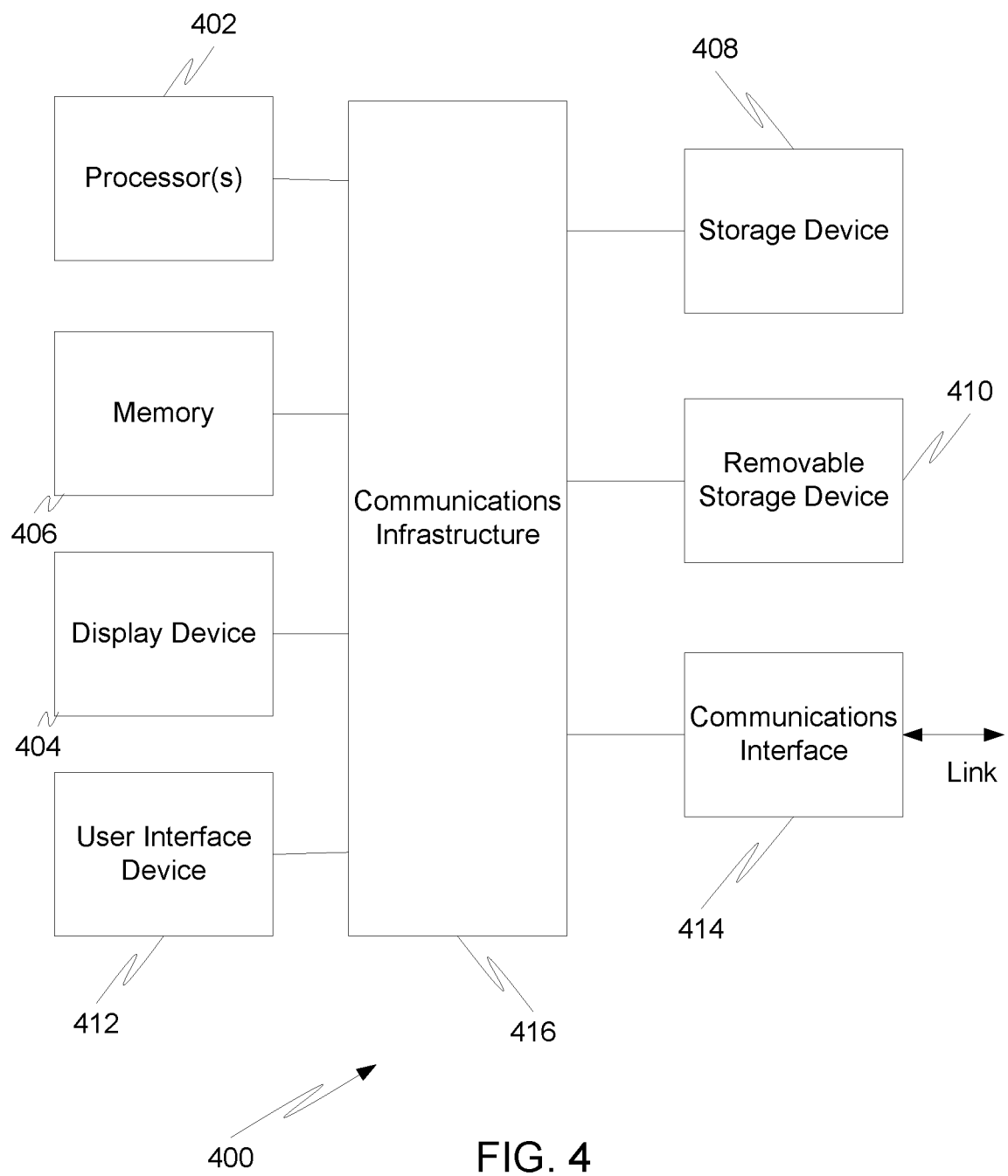
FIG. 4 is a schematic view of a computer system that may be used in practicing an embodiment.

FIG. 4 is a high level block diagram showing a computer system 400, which is suitable for implementing the controller 335 used in embodiments. The computer system 400 may have many physical forms ranging from an integrated circuit, a printed circuit board, and a small handheld device up to a huge supercomputer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communications interface 414 (e.g., wireless network interface). The communications interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communications link that carries signals and may be implemented using wire or cable, fiber optics, a phone line, a cellular phone link, a radio frequency link, and/or other communications channels. With such a communications interface 414, it is contemplated that the one or more processors 402 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer code include machine code, such as produced by a compiler, and files containing higher level code that is executed by a computer using an interpreter. Computer readable media may also be computer code transmitted by a computer data signal embodied in a carrier wave and representing a sequence of instructions that are executable by a processor.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for etching features in a silicon containing stack below a patterned mask in an etch chamber, comprising:
   a) partially etching the stack, comprising:
      providing a halogen containing etch gas; and
      forming the halogen containing etch gas into a halogen containing plasma, wherein the halogen containing plasma partially etches features into the stack, wherein the features have an etch front;
   b) depositing a metal catalyst containing layer on the etch front of the features, comprising:
      providing a metal catalyst containing gas;
      forming the metal catalyst containing gas into a metal catalyst containing plasma; and
      selectively depositing more of the metal catalyst containing layer on the etch front and bottoms of the features than tops of the features; and
   c) further etching the features, comprising:
      providing a fluorine containing etch gas; and
      forming the fluorine containing etch gas into a fluorine containing plasma, wherein the fluorine containing plasma selectively etches sidewalls adjacent to the etch front of the features with respect to sidewalls adjacent to tops of the features.

2. The method, as recited in claim 1, wherein the halogen containing etch gas is metal catalyst free.

3. The method as recited in claim 1, wherein the metal catalyst containing layer comprises at least one of a titanium containing component, a tungsten containing component, a cadmium containing component, and a palladium containing component.

4. The method, as recited in claim 1, wherein the features have a depth and wherein the partially etching the stack etches at least 90% of the depth of the features.

5. The method, as recited in claim 1, wherein a depth of the features is at least 1000 nm and wherein the features have a width of less than 120 nm.

6. The method, as recited in claim 1, wherein the partially etching is an anisotropic etch and the further etching is an isotropic etch.

7. The method, as recited in claim 1, wherein the metal catalyst containing gas comprises at least one of titanium tetrachloride ($TiCl_4$), titanium butoxide (Ti(OBu)4), titanium ethoxide ($Ti(OC_2H_5)_4$), titanium propoxide ($Ti(OCH(CH_3)_2)_4$), trimethoxy(pentamethycyclopentadienyl)titanium ($C_5(CH_3)_5Ti(OCH_3)_3$), and $Ti(NR_1R_2)_4$ where $R_1$ and $R_2$ could be $CH_3$, $C2H_5$ or $C3H_7$.

8. The method, as recited in claim 1, further comprising depositing a liner that is metal catalyst free after partially etching the stack and before depositing the metal catalyst containing layer.

9. The method, as recited in claim 8, wherein the liner is a carbon containing layer.

10. The method, as recited in claim 1, wherein the stack comprises a plurality of alternating layers of silicon oxide and polysilicon or alternating layers of silicon oxide and silicon nitride.

11. A method for etching features in a silicon containing stack below a patterned mask in an etch chamber, comprising:
   a) partially etching the stack, comprising:
      providing a halogen containing etch gas; and
      forming the halogen containing etch gas into a halogen containing plasma, wherein the halogen containing plasma partially etches features into the stack, wherein the features have an etch front;
   b) depositing a liner on sidewalls of the features;
   c) depositing a metal catalyst containing layer on the liner, comprising:
      providing a metal catalyst containing gas; and
      forming the metal catalyst containing gas into a metal catalyst containing plasma;
      wherein the metal catalyst containing plasma causes the metal catalyst containing layer to be deposited on the liner; and
   d) further etching the features, comprising:
      providing a fluorine containing etch gas; and
      forming the fluorine containing etch gas into a fluorine containing plasma, wherein the fluorine containing plasma selectively etches the liner near an etch front and forms a plasma of the metal catalyst containing layer, wherein the plasma of the metal catalyst containing layer isotropically etches the etch front.

12. The method, as recited in claim 11, wherein the halogen containing etch gas is metal catalyst free.

13. The method as recited in claim 11, wherein the metal catalyst containing layer comprises at least one of a titanium containing component, a tungsten containing component, a cadmium containing component, and a palladium containing component.

14. The method, as recited in claim 11, wherein the features have a depth and wherein the partially etching the stack etches at least 90% of the depth of the features.

15. The method, as recited in claim 11, wherein a depth of the features is at least 1000 nm and wherein the features have a width of less than 120 nm.

16. The method, as recited in claim 11, wherein the partially etching is an anisotropic etch and the further etching is an isotropic etch.

17. The method, as recited in claim 11, wherein the metal catalyst containing gas comprises at least one of titanium tetrachloride ($TiC_4$), titanium butoxide ($Ti(OBu)_4$), titanium ethoxide ($Ti(OC_2H_5)_4$), titanium propoxide ($Ti(OCH(CH_3)_2)_4$), trimethoxy(pentamethycyclopentadienyl)titanium ($C_5(CH_3)_5Ti(OCH_3)_3$), and $Ti(NR_1R_2)_4$ where $R_1$ and $R_2$ could be $CH_3$, $C2H_5$ or $C3H_7$.

18. The method, as recited in claim 11, wherein the liner is a carbon containing layer.

* * * * *